United States Patent [19]
DeLuca

[11] Patent Number: 5,679,180
[45] Date of Patent: Oct. 21, 1997

[54] γ′ STRENGTHENED SINGLE CRYSTAL TURBINE BLADE ALLOY FOR HYDROGEN FUELED PROPULSION SYSTEMS

[75] Inventor: Daniel P. DeLuca, Tequesta, Fla.

[73] Assignee: United Technologies Corporation, Hartford, Conn.

[21] Appl. No.: 493,610

[22] Filed: Jun. 22, 1995

[51] Int. Cl.$^6$ ................................ C22C 19/05
[52] U.S. Cl. ................ 148/404; 148/410; 148/419; 415/200
[58] Field of Search ............................ 148/410, 419, 148/404; 420/448

[56] References Cited

U.S. PATENT DOCUMENTS

| | | | |
|---|---|---|---|
| 2,570,194 | 10/1951 | Bieber et al. | 148/410 |
| 2,873,187 | 2/1959 | Dyrkacz et al. | 148/410 |
| 3,575,734 | 4/1971 | Muzyka | 148/410 |
| 3,972,752 | 8/1976 | Honnorat et al. | 148/410 |
| 5,395,584 | 3/1995 | Berger et al. | 420/443 |
| 5,470,371 | 11/1995 | Darolia | 148/514 |

FOREIGN PATENT DOCUMENTS

| | | |
|---|---|---|
| 0398264 | 11/1990 | European Pat. Off. . |
| 2232685 | 12/1990 | United Kingdom . |

OTHER PUBLICATIONS

DeLuca, D.P. and R.W Hatala; "Single Crystal PWA 1472 in High Pressure Hydrogen" Superalloys 718, 625, 706 and Variant Derivatives, Proc. Int'l Symp 3rd, 817–826 1994.

CA 121:210697a of "Single Crystal PWA 1472 in High Pressure Hydrogen" by D.P. DeLuca et al Oct. 31, 1994.

*Primary Examiner*—David A. Simmons
*Assistant Examiner*—Margery S. Phipps
*Attorney, Agent, or Firm*—Bachman & LaPointe, P.C.

[57] ABSTRACT

The present invention relates to a γ′′ strengthened nickel based alloy having an improved resistance to hydrogen embrittlement and to a process for forming the same. The nickel based alloy consists essentially of from about 0.02 to 0.06 wt % carbon, from about 11 to 13 wt % chromium, from about 17 to 19 wt % iron, from about 2.80 to 3.30 wt % molybdenum, from about 5.75 to about 6.25 wt % columbium+tantalum, from about 1.75 to 2.25 wt % titanium, from about 0.4 to 0.8 wt % aluminum and the balance essentially nickel and is in single crystal form. The nickel based alloy of the present invention has particular utility in high pressure hydrogen environments such as rocket engine components.

7 Claims, No Drawings

γ STRENGTHENED SINGLE CRYSTAL TURBINE BLADE ALLOY FOR HYDROGEN FUELED PROPULSION SYSTEMS

BACKGROUND OF THE INVENTION

The present invention relates to a γ" strengthened nickel-based alloy having an improved resistance to hydrogen embrittlement and to a process for forming such an alloy.

Precipitation strengthened (by γ' and/or γ") nickel base alloys have been the material of choice in many aerospace applications such as high stress, high temperature gas turbine applications. In turbine blade and vane applications, γ' alloys are cast in single crystal form. U.S. Pat. Nos. 4,116,723 to Gell et al., 4,209,348 to Duhl et al., 4,643,782 to Harris et al., 4,677,035 to Fiedler et al., 4,802,934 to Ohno et al., 4,885,216 to Naik, 4,888,069 to Duhl et al., 4,908,183 to Chin et al., 5,077,141 to Naik et al., 5,100,484 to Wukusick et al., and 5,154,884 to Wukusick et al. and Published European Patent Application No. 150,917 to Schweizer illustrate some of the single crystal nickel based alloys which have been used for gas turbine engine components and their processing.

Nickel base superalloys are also the materials of choice for liquid hydrogen fueled rocket engine turbopumps. They are used extensively in current versions of the NASA Space Shuttle Main Engine. When used in this environment, the nickel based alloys encounter hydrogen embrittlement.

Fundamental aspects of alloy structure play an important role when considering hydrogen embrittlement mechanisms. Cast γ' strengthened alloys such as single crystal PWA 1480 and equiaxed MAR-M-247 are used in turbopump hot section applications where temperatures approach 900° C. Columnar grain directionally solidified (DS) castings or single crystal forms are preferred for turbine blades and are exclusively of the γ' type. Equiaxed (EQ) castings again of the γ' type are used in vane applications. The γ' strengthening precipitate in these alloys is composed of alloyed $Ni_3Al$ with $L1_2$ order. It assumes a cuboidal morphology geometrically ordered in the γ matrix. The cube edges are aligned with the <001> directions.

γ" precipitation strengthened alloys such as INCO 718 find use in many structural applications such as pump housings and flanges. Their service temperature is generally limited to 650° C. They are used exclusively in equiaxed form, wrought or cast. The primary strengthening precipitate in these alloys is γ" (ordered $Ni_3Cb$) and assumes a lenticular morphology. γ" precipitates exhibit both atomic ($DO_{22}$) and geometric order, coherent with the <001> directions. They are much finer than those found in cast γ' strengthened alloys and of a lower volume fraction.

Many turbopump components are exposed to high pressure gaseous hydrogen during operation and the mechanical properties of nearly all of the materials employed are substantially degraded by this exposure. The effects of hydrogen on the fatigue and fracture characteristics of Ni base superalloys have been the subject of intensive research. The mechanisms of hydrogen degradation vary depending on, among other things, the alloy class (γ' or γ"), casting form (equiaxed, columnar grain or single crystal) and the particular mechanical property in question. Frequently degradation is the result of a microscopic fracture mode transition resulting from hydrogen induced changes in dislocation mobility.

Studies have examined hydrogen mechanisms in several cast γ' and γ" strengthened alloys. One of these investigations focused on two equiaxed alloys, PWA 1489 (a γ" alloy) and PWA 1490 alloy. Low cycle fatigue and fatigue crack growth specimens tested in high pressure hydrogen environments were compared to specimen fractures produced in air. In hydrogen, the γ' strengthened equiaxed alloy PWA 1489, a HIP'd microcast version of Mar-M-247, exhibited intergranular fracture plus isolated areas of γ–γ' decohesion at fatigue origins. This fracture mode (decohesion) is associated with large increases in fatigue crack growth in single crystal and columnar gain turbine blade alloys when tested in hydrogen.

Decohesion has been shown to be sub microscopic (111) fracture confined to the γ matrix phase. The result is a separation at the γ–γ' interface. The normal fracture mode observed in air is by shearing of γ' precipitates on (111) planes. The γ" alloy, PWA 1490, used in the studies also experienced the transition to intergranular fracture in the presence of hydrogen but did not show a tendency to fail by matrix/precipitate decohesion. The results of the study demonstrated that γ" strengthened alloys possess an intrinsic immunity to hydrogen induced matrix precipitate decohesion.

SUMMARY OF THE INVENTION

Accordingly, it is an object of the present invention to provide a nickel base alloy having improved resistance to hydrogen embrittlement.

It is a further object of the present invention to provide a nickel base alloy as above having utility in rocket engine turbopump applications.

It is a further object of the present invention to provide a process for forming a nickel base alloy having improved resistance to hydrogen embrittlement.

The foregoing objects are attained by the novel nickel base alloy of the present invention and the process for forming same.

In accordance with the present invention, a nickel base alloy having an improved resistance to hydrogen embrittlement is a γ" strengthened single crystal nickel base alloy containing from about 11 to 13 wt % chromium, from about 17 to 19 wt % iron, from about 2.8 to 3.3 wt % molybdenum, from about 1.75 to about 2.25 wt % titanium, from about 8.75 to about 6.25 wt % columbium and tantalum, from about 0.40 to about 0.80 wt % aluminum, from about 0.02 to about 0.06 carbon and the balance primarily nickel. In a preferred embodiment, the γ" strengthened nickel base alloy consists essentially of from about 0.02 to about 0.06 wt % carbon, up to about 0.35 wt % manganese, up to about 0.15 wt % silicon, up to about 0.015 wt % phosphorous, up to about 0.005 wt % sulfur, from about 11 to 13 wt % chromium, from about 17 to 19 wt % iron, up to about 1.0 wt % cobalt, from about 2.80 to 3.30 wt % molybdenum, from about 5.75 to 6.25 wt % columbium+tantalum, from about 1.75 to 2.25 wt % titanium, from about 0.4 to 0.8 wt % aluminum, up to about 0.005 wt % boron, up to about 0.10 wt % copper, up to about 0.03 wt % zirconium, up to about 5 ppm lead, up to about 0.3 ppm bismuth, up to about 3 ppm selenium, up to about 30 ppm oxygen, up to about 100 ppm nitrogen and the balance essentially nickel.

The γ" strengthened nickel based alloy of the present invention may be formed by providing a nickel base alloy as above in molten form, casting the nickel base alloy in single crystal form, and thereafter subjecting it to a two step heat treatment. During a first step of the heat treatment, the cast alloy is homogenized at a temperature in the range of from about 1200° C. to about 1250° C., preferably from about 1215° C. to about 1235° C., for a time period in the range of 3.75 to 4.25 hours. Thereafter, the homogenized cast alloy is cooled to room temperature and subjected to a second precipitation hardening heat treatment. The precipitation hardening heat treatment is carried out at a temperature in the range of from about 750° C. to about 800° C., preferable from about 750° C. to about 770° C., for a time in the range of from about 7.75 to about 8.25 hours.

Other details, objects and advantages of the γ" strengthened nickel base alloy of the present invention and the process for forming it are set forth in the following detailed description.

DETAILED DESCRIPTION OF THE PREFERRED EMBODIMENT(S)

As previously discussed, the present invention relates to a γ" strengthened nickel base alloy have improved resistance to hydrogen embrittlement. The improved nickel base alloy in accordance with the present invention contains from about 11 to 13 wt % chromium, from about 17 to 19 wt % iron, from about 2.8 to about 3.3 wt % molybdenum, from about 1.75 to about 2.25 wt % titanium, from about 5.75 to 6.25 wt % columbium and tantalum, from about 0.02 to 0.06 wt % carbon, from about 0.40 to 0.80 wt % aluminum/, and the balance primarily nickel. In a preferred embodiment, the nickel base alloy of the present invention consists essentially of from about 0.02 to about 0.06 wt % carbon, up to about 0.35 wt % manganese, up to about 0.15 wt % silicon, up to about 0.015 wt % phosphorous, up to about 0.005 wt % sulfur, from about 11 to 13 wt % chromium, from about 17 to 19 wt % iron, up to about 1.0 wt % cobalt, from about 2.8 to 3.3 wt % molybdenum, from about 5.75 to 6.25 wt % columbium+tantalum, from about 1.75 to 2.25 wt % titanium, from about 0.4 to 0.8 wt % aluminum, up to about 0.005 wt % boron, up to about 0.1 wt % copper, up to about 0.03 wt % zirconium, up to about 5 ppm lead, up to about 0.3 ppm bismuth, up to about 3 ppm selenium, up to about 30 ppm oxygen, up to about 100 ppm nitrogen and the balance essentially nickel.

The nickel base alloy of the present invention must be cast as a single crystal so as to provide the desired resistance to hydrogen embrittlement. The formation of the alloy into single crystal form is a critical aspect of the present invention, but the method of single crystal formation is unimportant. One method which can be used is described in U.S. Pat. No. 3,494,709, which is hereby incorporated by reference. Another method which can be used consists of pouring superheated metal into a ceramic mold under high vacuum conditions and withdrawing heat from the lower portion of the mold which is seated on a water-cooled copper chill. Grains are nucleated on the chill surface and grow in a columnar manner parallel to a unidirectional temperature gradient. At the water-cooled copper chill, many grains are nucleated with essentially random orientations. However, the <001> growth rate is higher than others. As solidification proceeds, the grains enter a helical single crystal selector. After one or two turns of the helix, only one crystal survives and this grain fills the entire mold cavity.

After casting, the material is subjected to a homogenization treatment. The homogenization treatment is carried out at a temperature in the range of from about 1200° C. to about 1250° C., preferably from about 1215° C. to about 1235° C., for a time in the range of from about 3.75 to about 4.25 hours. The homogenization treatment may be carried out using any suitable heat treatment device known in the art and using any suitable protective atmosphere. During this homogenization treatment, all phases precipitated during solidification are put into solution.

After homogenization, the material is cooled to room temperature. This can be done using fan cooling. Thereafter, the material is subjected to a precipitation hardening treatment. The precipitation hardening treatment is carried out at a temperature in the range of from about 750° C. to about 800° C., preferably from about 750° C. to about 770° C., for a time in the range of from about 7.75 hours to about 8.25 hours. The precipitation hardening treatment may be carried out using any suitable heat treatment device known in the art and using any suitable protective atmosphere. This treatment is intended to precipitate a high volume fraction of fine γ" precipitates.

One method of expressing the susceptibility of a particular material to hydrogen degradation relative to that of another material is to determine each material's hydrogen to air debit for some mechanical property known to be degraded by exposure to hydrogen. In order to demonstrate the improvements obtained by the nickel base alloy of the present invention, the following example was performed.

A mold of cast test bars of a nickel base alloy having a nominal composition of 12 wt % chromium, 18 wt % iron, 2.0 wt % titanium, 0.60 wt % aluminum, 3.05 wt % molybdenum, 6.0 wt % columbium+tantalum, 0.04 wt % carbon and the balance nickel was produced in single crystal form. The bars were 0.5 cm in diameter and approximately 10 cm. long. The material was homogenized at 1225° C. for four hours followed by a fan cool to room temperature. Thereafter, a precipitation treatment was carried out at 760° C. for eight hours.

Notched low cycle fatigue test specimens were machined from the cast bars. Low cycle fatigue tests were conducted at 26° C. with a stress ratio of 0.05 at 0.17 Hz. Cylindrical gage notched low cycle fatigue specimens were tested at a net section stress of 620.5 MPa in air and 34.5 MPa in gaseous hydrogen. Fatigue life (cycles to failure) was determined in air and hydrogen and the ratio of air to hydrogen fatigue life was determined.

The results of these tests showed that the single crystal nickel based alloy made in accordance with the present invention did not exhibit a hydrogen induced fracture mode transition. The microscopic fracture mode in both air and hydrogen was crystallographic along (111) octahedral planes.

Additionally, the notched low cycle fatigue life for the single crystal nickel base alloy made in accordance with the present invention in hydrogen was greater than that of PWA 1480, a γ' strengthened turbine blade alloy used in advanced NASA Space Shuttle Main Engine turbopump designs, in hydrogen and the air to hydrogen life ratio was found to be only 5X, significantly lower than the 100X ratio observed for PWA 1480, It is apparent from these tests that γ" strengthened single crystal nickel based alloys formed in accordance with the present invention can be used to manufacture components for hydrogen fueled rocket engine components such as turbopumps.

It is apparent that there has been provided in accordance with this invention a γ" strengthened single crystal turbine blade alloy for hydrogen fueled propulsion systems which fully satisfies the objects, means and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed is:

1. A nickel based alloy having an improved resistance to hydrogen embrittlement, said alloy consisting essentially of from about 11 to 13 wt % chromium, from about 17 to 19 wt % iron, from about 2.8 to 3.3 wt % molybdenum, from about 1.75 to 2.25 wt % titanium, from about 5.75 to 6.25 wt % columbium+tantalum, from about 0.4 to 0.8 wt % aluminum, from about 0.02 to 0.06 wt % carbon and the balance primarily nickel and being cast in single crystal form, wherein said alloy is $\gamma''$ strengthened, and wherein when subjected to fatigue life tests in air and hydrogen said alloy does not exhibit a hydrogen induced fracture mode transition, and wherein said alloy is characterized by improved notched low cycle fatigue life in hydrogen with the air to hydrogen life ratio being substantially no greater than 5×.

2. The nickel based alloy of claim 1 wherein said alloy further contains up to about 0.35 wt % manganese, up to about 0.15 wt % silicon, up to about 0.015 wt % phosphorous, up to about 0.005 wt % sulfur, up to about 1.0 wt % cobalt, up to about 0.005 wt % boron, up to about 0.10 wt % copper, up to about 0.03 wt % zirconium, up to about 8 ppm lead, up to about 0.3 ppm bismuth, up to about 3 ppm selenium, up to about 30 ppm oxygen and up to about 100 ppm nitrogen.

3. The alloy of claim 1 wherein said alloy is homogenized and precipitation hardened.

4. An article suitable for use in rocket turbopump applications, said article comprising a $\gamma''$ strengthened nickel based alloy in single crystal form having a composition consisting essential of from about 0.02 to 0.06 wt % carbon, from about 11 to 13 wt % chromium, from about 17 to 19 wt % iron, from about 2.80 to 3.30 wt % molybdenum, from about 5.75 to about 6.25 wt % columbium+tantalum, from about 1.75 to 2.25 wt % titanium, from about 0.4 to 0.8 wt % aluminum and the balance essentially nickel, and wherein the air to hydrogen life ratio is substantially no greater than 5×.

5. A heat treated article having improved resistance to hydrogen embrittlement, said article comprising a nickel base alloy consisting essentially of from about 0.02 to 0.06 wt % carbon, from about 11 to 13 wt % chromium, from about 17 to 19 wt % iron, from about 2.80 to 3.30 wt % molybdenum, from about 5.75 to about 6.25 wt % columbium+tantalum, from about 1.75 to 2.25 wt % titanium, from about 0.4 to 0.8 wt % aluminum and the balance essentially nickel in single crystal form.

6. The heat treated article of claim 5 wherein said nickel base alloy is homogenized and $\gamma''$ precipitation hardened.

7. A nickel based alloy having an improved resistance to hydrogen embrittlement, said alloy consisting essentially of from about 11 to 13 wt % chromium, from about 17 to 19 wt % iron, from about 2.8 to 3.3 wt % molybdenum, from about 1.75 to 2.25 wt % titanium, from about 5.75 to 6.25 wt % columbium+tantalum, from about 0.4 to 0.8 wt % aluminum, from about 0.02 to 0.06 wt % carbon and the balance primarily nickel and being cast in single crystal form, wherein said alloy is $\gamma''$ strengthened, and wherein when subjected to fatigue life tests in air and hydrogen said alloy does not exhibit a hydrogen induced fracture mode transition, and wherein said alloy is characterized by improved notched low cycle fatigue life in hydrogen with the air to hydrogen life ratio being substantially no greater than 5×, and wherein said alloy is homogenized and precipitation hardened.

* * * * *

UNITED STATES PATENT AND TRADEMARK OFFICE
CERTIFICATE OF CORRECTION

PATENT NO. : 5,679,180
DATED : October 21, 1997
INVENTOR(S) : DANIEL P. DeLUCA

It is certified that error appears in the above-indentified patent and that said Letters Patent is hereby corrected as shown below:

On the title page: Item [54] and Column 1, line 1,

In the title, "$\gamma$ STRENGTHENED" should read -- $\gamma$" STRENGTHENED--.

Signed and Sealed this

Third Day of February, 1998

BRUCE LEHMAN

Attest:

Attesting Officer

Commissioner of Patents and Trademarks